United States Patent
Kuo et al.

(10) Patent No.: US 9,489,995 B2
(45) Date of Patent: Nov. 8, 2016

(54) MEMORY DEVICE FOR REALIZING SECTOR ERASE FUNCTION AND OPERATING METHOD THEREOF

(71) Applicant: MACRONIX INTERNATIONAL CO., LTD., Hsinchu (TW)

(72) Inventors: Nai-Ping Kuo, Hsinchu (TW); Cai-Yun Wu, Suzhou (CN)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 0 days.

(21) Appl. No.: 14/494,687

(22) Filed: Sep. 24, 2014

(65) Prior Publication Data
US 2016/0086643 A1 Mar. 24, 2016

(51) Int. Cl.
G11C 11/34 (2006.01)
G11C 8/08 (2006.01)
G11C 8/14 (2006.01)
G11C 16/16 (2006.01)

(52) U.S. Cl.
CPC . *G11C 8/08* (2013.01); *G11C 8/14* (2013.01); *G11C 16/16* (2013.01)

(58) Field of Classification Search
USPC ............ 365/185.11, 185.18, 185.23, 185.29, 365/185.33
See application file for complete search history.

(56) References Cited

U.S. PATENT DOCUMENTS

| | | | | |
|---|---|---|---|---|
| 5,886,923 A * | 3/1999 | Hung | ............... | G11C 16/08 365/185.11 |
| 6,091,633 A * | 7/2000 | Cernea | ............... | G11C 7/18 365/185.33 |
| 6,914,815 B2 * | 7/2005 | Kamei | ............... | G11C 7/12 365/185.11 |
| 7,450,434 B2 * | 11/2008 | Tanuma | ............... | G11C 16/08 365/185.11 |
| 7,466,605 B2 * | 12/2008 | Shimizu | ............... | G11C 16/08 365/185.23 |
| 8,027,196 B1 * | 9/2011 | Wong | ............... | G11C 11/5628 365/185.18 |
| 8,654,591 B2 * | 2/2014 | Akaogi | ............... | G11C 8/08 365/185.11 |
| 8,982,641 B2 * | 3/2015 | Lu | ............... | G11C 16/16 365/185.11 |

FOREIGN PATENT DOCUMENTS

JP     GB 2429315 A *  2/2007  ............ G11C 16/08

* cited by examiner

*Primary Examiner* — Trong Phan
(74) *Attorney, Agent, or Firm* — McClure, Qualey & Rodack, LLP

(57) ABSTRACT

A memory device comprises a plurality of sectors and a driving circuit comprising a global word line driver and a first local word line driver. The global word line driver applies an erasing voltage to a selected sector of the sectors via a global word line. The first local word line driver, coupled to the global word line, drives a first local word line of the selected sector with a biasing voltage, so that the first local word line has a first voltage level corresponding to a non-erased state.

17 Claims, 5 Drawing Sheets

MEMORY DEVICE FOR REALIZING SECTOR ERASE FUNCTION AND OPERATING METHOD THEREOF

TECHNICAL FIELD

The disclosure relates in general to a memory device and an operating method thereof, and more particularly to a memory device and an operating method capable of realizing sector erase function.

BACKGROUND

In nonvolatile memory such as flash memory, the sector erase operation is performed on memory cells by applying a global word line voltage to a memory sector to be erased.

Conventionally, if the global word line voltage is at a negative level, all local word lines of the memory sector will be set to an erased status. In such configuration, the number of needed global word lines directly depends on the size of the sector unit. That is, when the sector unit size becomes more less, the needed global word line number will be more. However, the increment of needed global word line number will increase the total circuit area.

SUMMARY

The disclosure is directed to a memory device and an operating method capable of realizing erase function of global word lines without limited by the sector unit size.

According to one embodiment, a memory device is provided. The memory device comprises a plurality of sectors and a driving circuit comprising a global word line driver and a first local word line driver. The global word line driver applies an erasing voltage to a selected sector of the sectors via a global word line. The first local word line driver, coupled to the global word line, drives a first local word line of the selected sector with a biasing voltage, so that the first local word line has a first voltage level corresponding to a non-erased state.

According to another embodiment, a memory device is provided. The memory device comprises a first local word line driver and a second local word line driver. The first local word line driver drives a first local word line with a biasing voltage, so that the first local word line has a first voltage level corresponding to a non-erased state. The second local word line driver drives a second local word line with the erasing voltage, so that the second local word line has a second voltage level corresponding to an erased state.

According to yet another embodiment, an operating method of a memory device is provided, wherein the memory device comprises a plurality of local word lines. The operating method comprises the following steps: driving a first local word line of the local word lines with a biasing voltage, so that the first local word line has a first voltage level corresponding to a non-erased state; and driving a second local word line of the local word lines with the erasing voltage, so that the second local word line has a second voltage level corresponding to an erased state.

The above and other aspects of the invention will become better understood with regard to the following detailed description of the embodiments. The following description is made with reference to the accompanying drawings.

Figure 1:
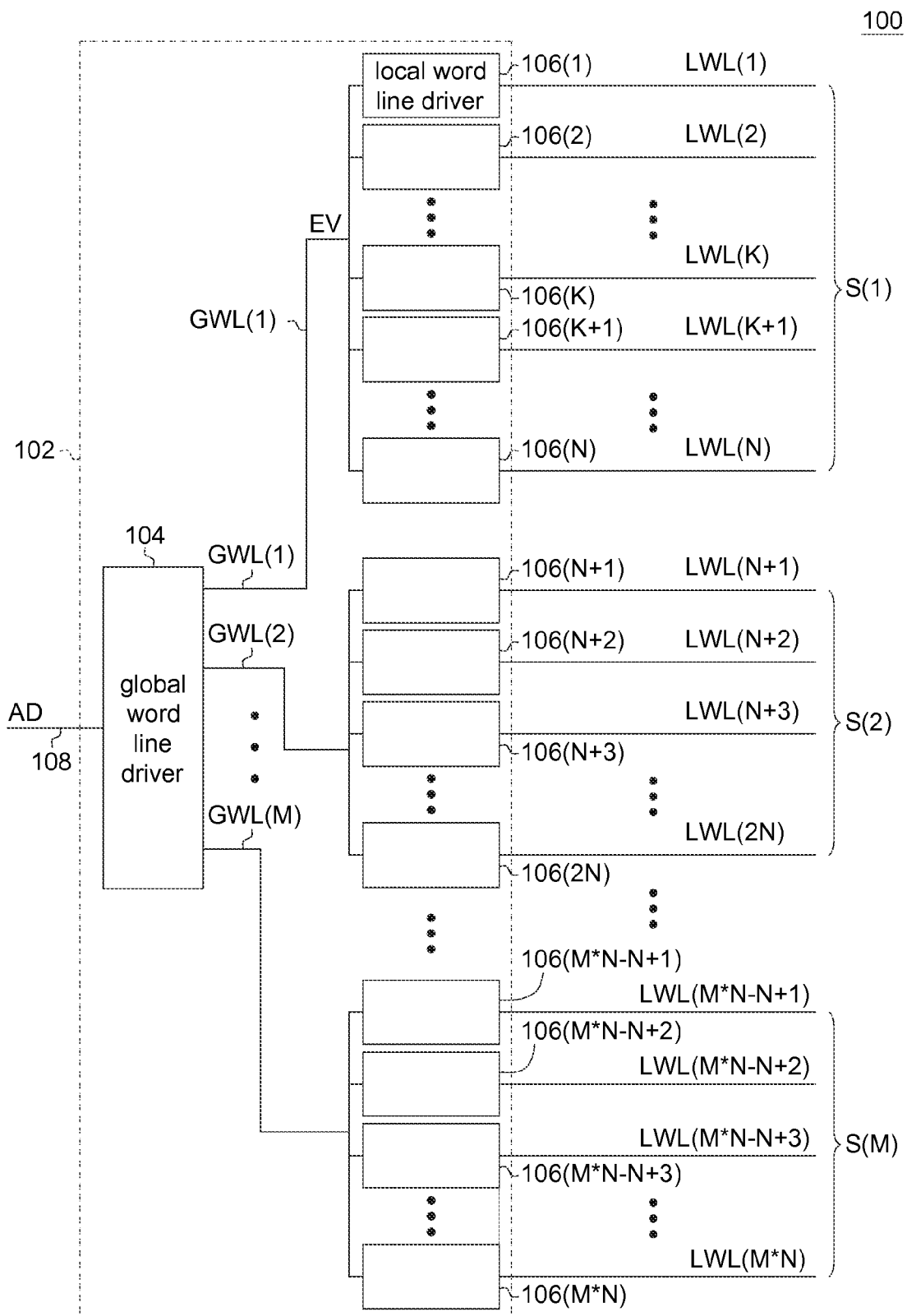
FIG. 1 shows a simplified block diagram of a memory device according to an embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 shows a simplified block diagram of a memory device 100 according to an embodiment of the present invention. The memory device 100 comprises a plurality of sectors (ex., S(1)-S(M), M is a natural integer) and a driving circuit 102. Each of the sectors S(1)-S(M) comprises a plurality of local word lines that each is coupled to a plurality of memory cells. As shown in FIG. 1, the sector S(1) comprises local word lines LWL(1)-LWL(N), the sector S(2) comprises local word lines LWL(N+1)-LWL(2N), and the sector S(M) comprises local word lines LWL(M*N-N+1)-LWL(M*N). In another example, each of the sectors S(1)-S(M) can have different number of local word lines. The driving circuit 102 comprises a global word line driver 104 and a plurality of local word line drivers (ex., 106(1)-106(M*N)). The global word line driver 104 applies global word line voltages to the local word line drivers 106(1)-106(M*N) via the global word lines (ex. GWL(1)-GWL(M)) to control the state of the local word lines LWL(1)-LWL(M*N).

The driving circuit 102 performs erase operations of the local word lines LWL(1)-LWL(M*N) in respond to an address signal AD supplied on the bus 108. For example, if the local word lines LWL(1)-LWL(K) are selected to be erased, the global word line driver 104 applies an erasing voltage EV to the selected sector S(1), which comprises the selected local word lines LWL(1)-LWL(K), to set the voltage levels of the selected local word lines LWL(1)-LWL(K) as a voltage level corresponding to an erased state. Meanwhile, the de-selected local word lines (i.e., LWL(K+1)-LWL(N)) of the selected sector S(1) are driven by de-selected local word line drivers (ex., 106(K+1)-106(N)) to maintain a voltage level corresponding to a non-erased state. In the embodiment, the de-selected local word line driver (ex., 106(K+1)) drives its corresponding de-selected local word line (ex., LWL(K+1)) with a biasing voltage NVSS to cause the corresponding local word line (ex., LWL(K+1)) to have a voltage level corresponding to the non-erased state.

And, the selected local word line driver (ex., 106(1)) drives its corresponding selected local word line (ex., LWL(1)) with the erasing voltage EV to cause the corresponding local word line (ex., LWL(1)) to have a voltage level corresponding to the erased state.

Usually, the erasing voltage EV is at a negative voltage level and the biasing voltage NVSS is at a positive voltage level in an erasing phase of the erasing operation. In such situation, the local word line (ex., LWL(1)) driven by the selected local word driver (ex., 106(1)) will have a negative voltage level, and the local word line (ex., LWL(K+1)) driven by the de-selected local word driver (ex., 106(K+1)) will be pulled up to a positive voltage to avoid erase disturbance.

Because the de-selected local word lines of the selected sector are not set to the erased status in respond to the erasing voltage EV, the driving circuit 102 can perform erase operations of the local word lines without limited by the sector unit size. Even if the sector unit size becomes less, the number of needed global word lines GWL can be decreased or remain unchanged.

Figure 2:
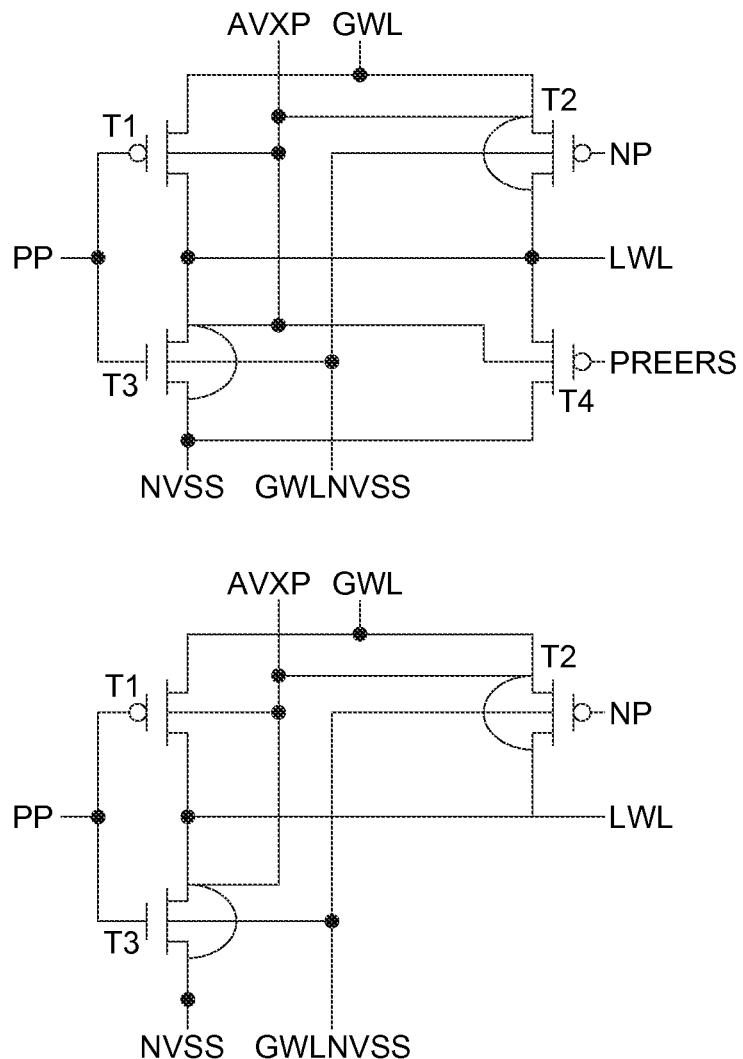
FIG. 2 shows a circuit diagram of a local word line driver according to an embodiment of the invention.

FIG. 2 shows a circuit diagram of a local word line driver according to an embodiment of the invention. The local word line driver can be two structures. First, the local word line driver comprises a first transistor T1, a second transistor T2, a third transistor T3 and a fourth transistor T4 (the upper one in the figure). Second, the local word line driver comprises a first transistor T1, a second transistor T2 and a third transistor T3 (the lower one in the figure). The first transistor T1 can be a p-type transistor, having a first terminal coupled to a global word line GWL, a second terminal couple to a local word line LWL and a third terminal for receiving a first control signal PP. The second transistor T2 can be a n-type transistor, having a first terminal coupled to the global word line GWL, a second terminal couple to the local word line LWL and a third terminal for receiving a second control signal NP. The third transistor T3 can be a n-type transistor, having a first terminal coupled to the local word line LWL, a second terminal couple to a biasing voltage NVSS and a third terminal for receiving the first control signal PP. The fourth transistor T4 can be a p-type transistor, having a first terminal coupled to the local word line LWL, a second terminal couple to the biasing voltage NVSS and a third terminal for receiving a third control signal PREERS. Each transistor T1-T4 can be a tri well MOS and biased by voltage AVXP and/or GWLNVSS. The voltage level of AVXP can be larger than or equal to GWL and the voltage level of GWLNVSS can be smaller than or equal to biasing voltage NVSS. In an example, the fourth transistor T4 is needed only when the third transistor T3 can't couple the local word line LWL to biasing voltage NVSS. The size of the fourth transistor T4 is decided enough to prevent the voltage dip of the local word line LWL caused by the leakage current and couple effect when the transistor T3 can't couple the local word line LWL to biasing voltage NVSS, so the size of the fourth transistor T4 can be minimized if the transistor T4 is needed.

Figure 3:
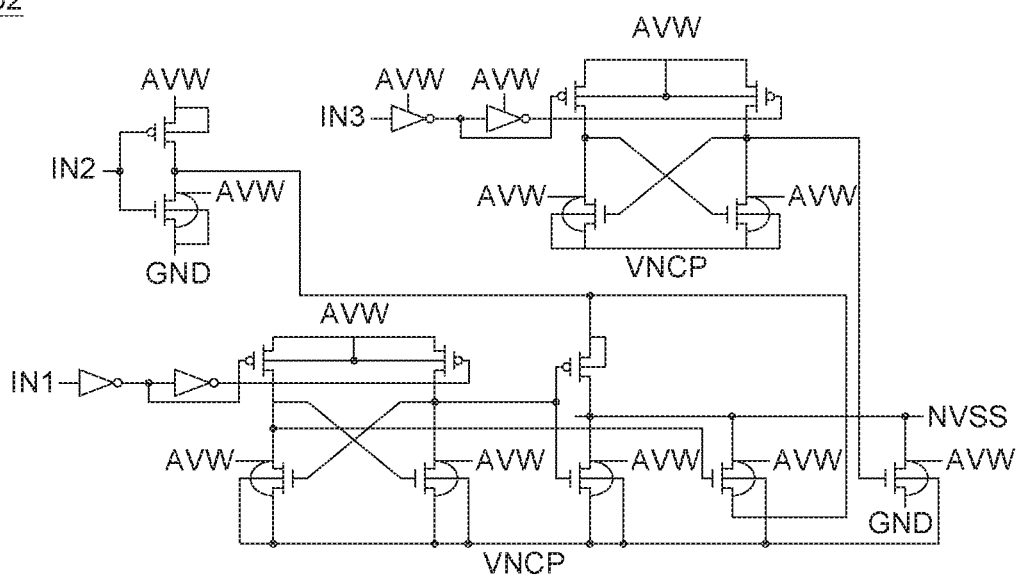
FIG. 3 shows a circuit diagram of a power supply for providing the biasing voltage.

FIG. 3 shows a circuit diagram of a power supply 302 for providing the biasing voltage NVSS. The power supply 302 is used to supply a negative voltage, a ground voltage or a positive voltage as the biasing voltage NVSS in respond to the control signals IN1, IN2 and IN3. AVW and VNCP are power sources. Power source VNCP can be negative power or ground voltage (GND). It is understood that the circuit structure of the power supply 302 shown in FIG. 3 is just one way of implementing the present invention. It is given for illustration purposes, not for restriction purposes, as the power supply 302 of present invention may be implemented in many different ways in accordance with the principles of the present invention.

Figure 4:
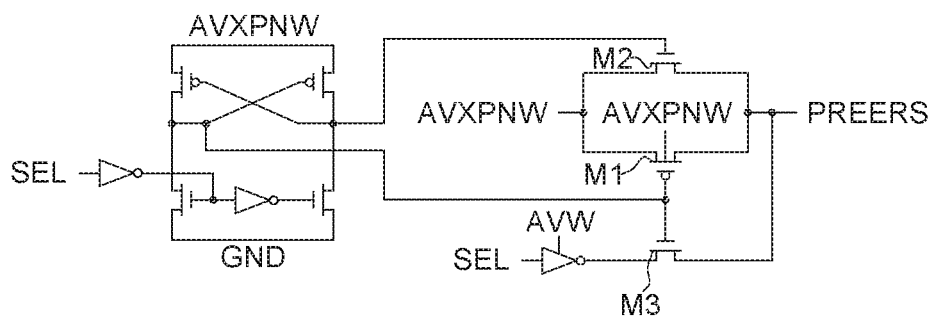
FIG. 4 shows a circuit diagram of a control circuit for providing the third control signal to the fourth transistor of the local word line driver.

FIG. 4 shows a circuit diagram of a control circuit 402 for providing the third control signal PREERS to the fourth transistor T4 of the first local word line driver structure. As shown in FIG. 4, the control circuit 402 enables the third control signal PREERS in respond to the control signals SEL and AVXPNW. The control circuit 402 can be shared by one chip or multiple memory blocks for saving the circuit area. As is clearly shown in Fig. 4, the voltage level of the third control signal PREERS can be set to either the inversed SEL or the AVXPNW. In particular, when the gate voltage of transistor M3 is "HIGH", transistors M1 and M2 will be turned off, and the transistor M3 will be turned on, so that the inversed SEL can be passed to the node of PREERS. Conversely, when the gate voltage of transistor M3 is "LOW", transistor M1 and M2 will be turned on, and the transistor M3 will be turned off, so that the AVXPNW can be passed to the node of PREERS.

Figure 5:
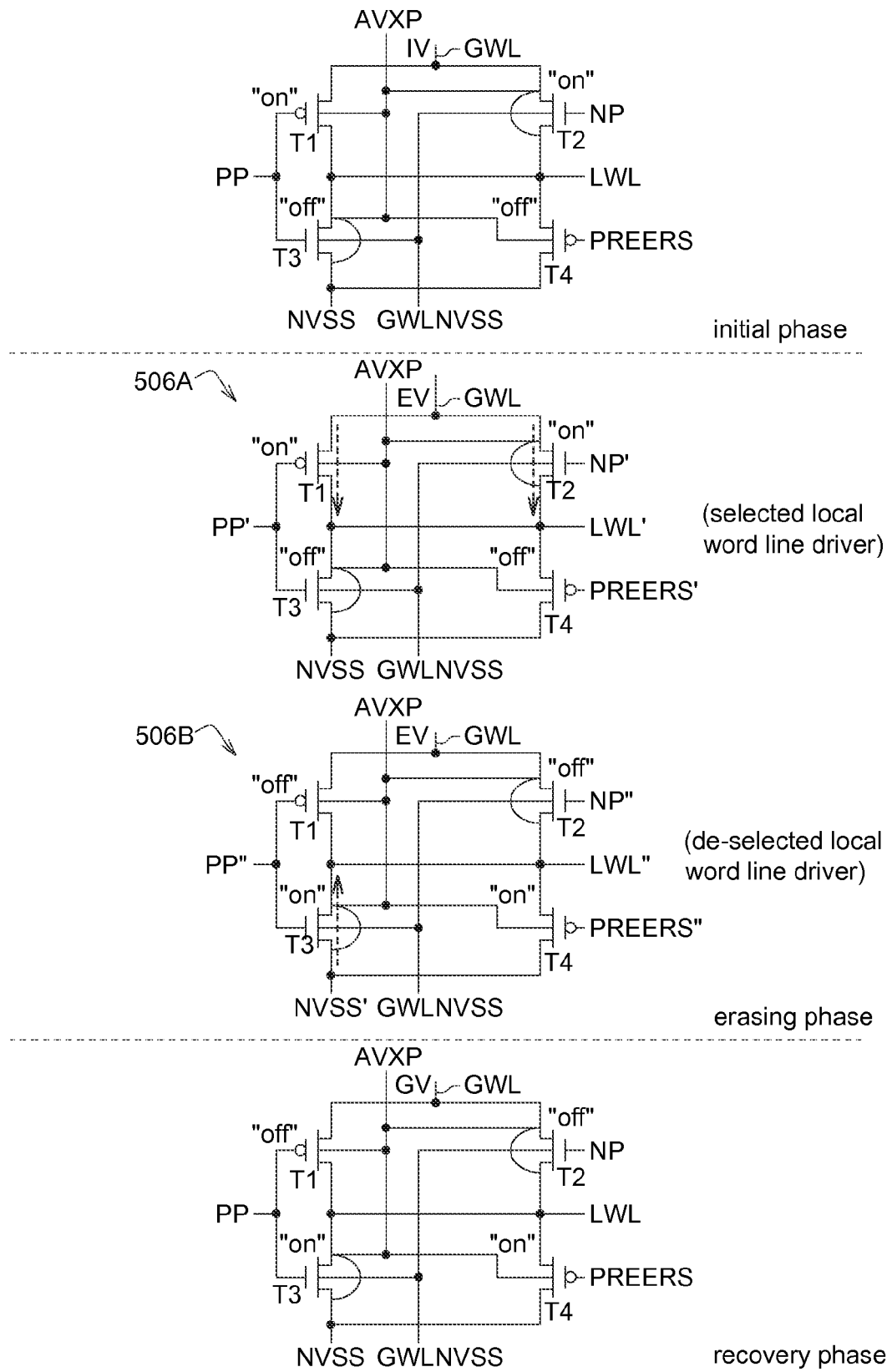
FIG. 5 shows a schematic diagram of the erase operation according to an embodiment of the invention.

FIG. 5 shows a schematic diagram of the erase operation according to an embodiment of the invention. For the following erase operation, the transistor T4 can be omitted if the local word line LWL is couple to the biasing voltage NVSS by the third transistor T3, while the erase operation of the transistors T1-T3 remains the same. The erase operation comprises an initial phase, an erasing phase and a recovery phase. In the initial phase, an initial voltage IV is applied to the global word line GWL to set the voltage level of the local word line LWL as a positive voltage level corresponding to the initial voltage IV. As shown in FIG. 5, the first and second transistors T1, T2 of the local word line driver are turned on and the third and fourth transistors T3, T4 are turned off, so the initial voltage IV can be passed to the local word line LWL through the first and second transistors T1, T2.

In the erasing phase, an erasing voltage EV is applied to a selected local word line driver 506A and a de-selected local word line driver 506B via the same global word line GWL. As earlier described, the erasing voltage EV may be, for example, a negative voltage. The switching of the first to fourth transistors T1-T4 of the selected local word line driver 506A in the erasing phase remains the same status as in the initial phase. As shown in FIG. 5, the first and second transistors T1, T2 of the selected local word line driver 506A are turned on by the corresponding first and second control signals PP', NP', and the third and fourth transistors T3, T4 of the selected local word line driver 506A are turned off by the first control signal PP' and the third control signal PREERS', respectively. Thus, the erasing voltage EV can be passed to the corresponding local word line LWL' through the first and second transistors T1, T2 of the selected local word line driver 506A.

The local word line LWL" not selected to be erased is driven by the de-selected local word line driver 506B. The first and second transistors T1, T2 of the de-selected local word line driver 506B are turned off by the corresponding first and second control signals PP", NP", and the third fourth transistors T3, T4 are turned on by the first control signal PP" and the third control signal PREERS", respectively, so the biasing voltage NVSS can be passed to the corresponding local word line LWL" through the third and fourth transistors T3, T4.

In the recovery phase, the voltage of the global word line GWL and the biasing voltage NVSS are set to a ground voltage level. As shown in FIG. 5, by turning off the first and second transistors T1, T2 and turning on the third and fourth transistors T3, T4 of the local word line driver, the ground voltage GV can be passed to the corresponding local word line LWL.

Figure 6:
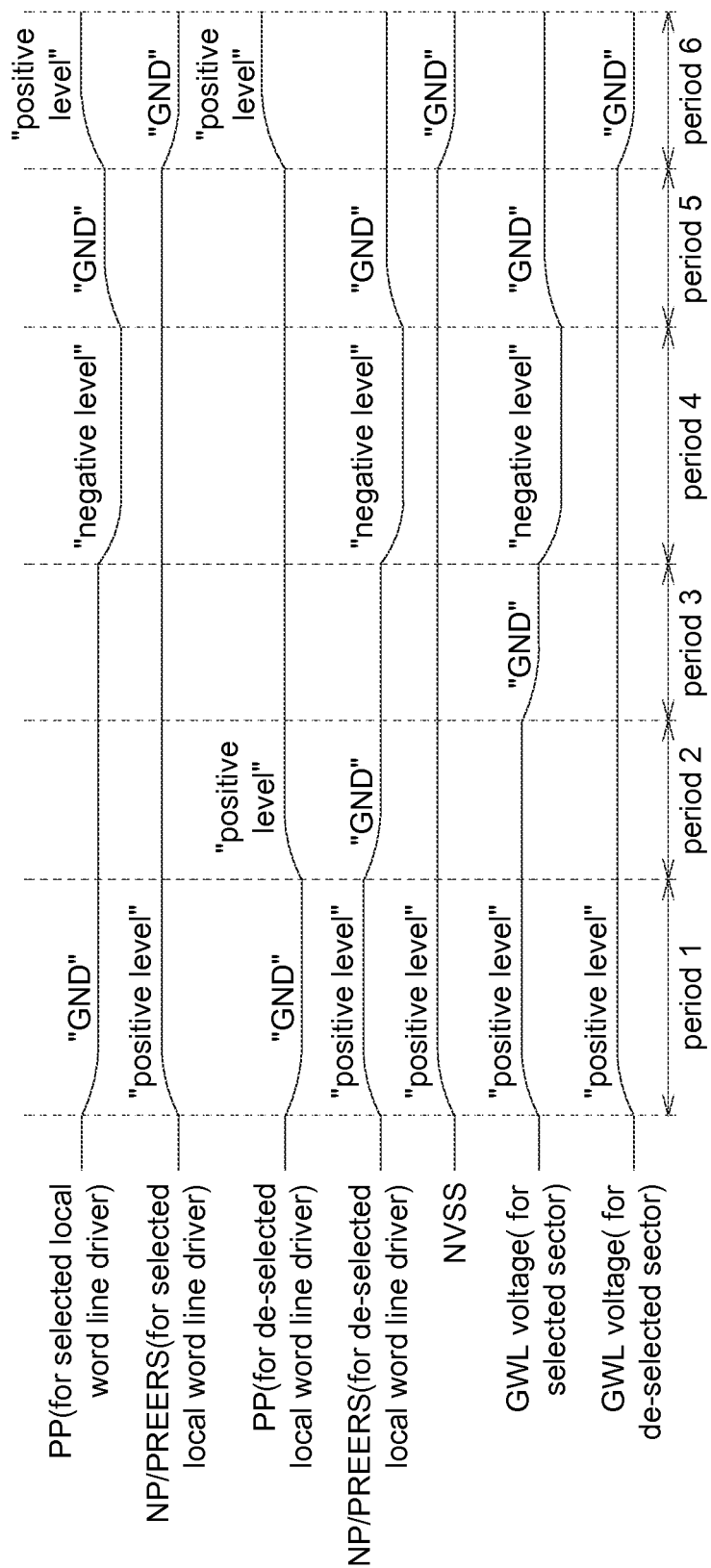
FIG. 6 shows the waveform diagram of the associated control signals of the memory device.

FIG. 6 shows the waveform diagram of the associated control signals of the memory device 100. As can be seen from FIG. 6, in the initial phase (period 1), the first control signal PP for all local word line drivers 106(1)-106(M*N) has a GND voltage level and the second control signal NP for all local word line drivers has a positive voltage level, so the first and second transistors T1, T2 of the local word line drivers 106(1)-106(M*N) can be turned on to pass a positive global word line voltage.

In the erasing phase (periods 2 to 5), the global word line voltage for the selected sector (ex., S(1)) goes low, while the global word line voltage for the de-selected sector (ex., S(2)) is still at a positive voltage level. As earlier described, for a de-selected local word line driver (ex., 106(K+1)) of the selected sector, the first and second transistors T1, T2 are turned off by the first and second control signals PP, NP, respectively, and the third and fourth transistors T3, T4 are turned on by the first signal PP and the third signal PREERS, respectively. Thus, the biasing voltage NVSS (with a positive voltage level) can be passed to the de-selected local word line (ex., LWL(K+1)) in the erasing phase. On the other hand, for a selected local word line driver (ex., 106(1)) of the selected sector, the first and second transistors T1, T2 are turned on by the first and second control signals PP, NP. Thus, the global word line voltage for the selected sector can be passed to the selected local word line (ex., LWL(1)) in the erasing phase. In the recovery phase (period 6), the global word line voltages for all sectors S(1)-S(M) and the biasing voltage NVSS are set to a ground voltage to recovery the status of all local word lines LWL(1)-LWL(M*N).

An operating method of the memory device 100 is provided. The operating method comprises the following steps. First, a local word line coupled to the de-selected local word line driver is driven by a global word line with a biasing voltage equal to NVSS, so that the local word line has a first voltage level corresponding to a non-erased state. Second, an erasing voltage EV is applied to a de-selected local word line driver and a selected local word line driver via a global word line. Then, a local word line coupled to the de-selected local word line driver is driven by a biasing voltage NVSS, so that the local word line has a first voltage level corresponding to a non-erased state. And, a local word line coupled to the selected local word line driver is driven by the erasing voltage EV, so that the local word line has a second voltage level corresponding to an erased state.

The memory device and the operating method thereof according to the embodiments of the invention perform sector erase functions without limited by the sector unit size. Accordingly, even if the sector unit size becomes less, the number of needed global word lines GWL can be decreased or remain unchanged.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:
1. A memory device, comprising:
a plurality of sectors; and
a driving circuit comprising:
a global word line driver, applying an erasing voltage to a selected sector of the sectors via a global word line; and
a first local word line driver coupled to the global word line, driving a first local word line of the selected sector with a biasing voltage, so that the first local word line has a first voltage level corresponding to a non-erased state;
wherein the first local word line driver comprises:
a first transistor coupled between the global word line and the first local word line, wherein the first transistor is controlled by a first control signal;
a second transistor coupled between the global word line and the first local word line, wherein the second transistor is controlled by a second control signal;
a third transistor coupled between the first local word line and a power source for providing the biasing voltage, wherein the third transistor is controlled by the first control signal; and
a fourth transistor coupled to the first local word line, wherein the fourth transistor is controlled by a third control signal;
wherein in an erasing phase, the first and second transistors are turned off by the first and second control signals, respectively, and the third and fourth transistors are turned on by the first and third control signals, respectively.

2. The memory device according to claim 1, further comprising:
a second local word line driver coupled to the global word line, wherein the second local word line driver drives a second local word line of the selected sector with the erasing voltage in an erasing phase, so that the second local word line has a second voltage level corresponding to an erased state.

3. The memory device according to claim 2, wherein the second local word line driver comprises:
a fifth transistor coupled between the global word line and the second local word line, wherein the fifth transistor is controlled by a fourth control signal;
a sixth transistor coupled between the global word line and the second local word line, wherein the sixth transistor is controlled by a fifth control signal;
a seventh transistor coupled between the second local word line and a power source for providing the biasing voltage, wherein the seventh transistor is controlled by the fourth control signal; and
an eighth transistor coupled to the second local word line, wherein the eighth transistor is controlled by a sixth control signal;
wherein in the erasing phase, the fifth and sixth transistors are turned on by the fourth and fifth control signals, respectively, and the seventh and eighth transistors are turned off by the fourth and sixth control signals, respectively.

4. The memory device according to claim 1, wherein the voltage level of the biasing voltage is a negative voltage level, a positive voltage level or a ground voltage level.

5. The memory device according to claim 1, wherein in an erasing phase, the erasing voltage is at a negative voltage level and the biasing voltage is at a positive voltage level.

6. The memory device according to claim 1, wherein each of the sectors comprises a plurality of local word lines, and the global word line driver applies an initial voltage, in an initial stage, to the sectors that need the biasing voltage to set the voltage levels of the local word lines as the first voltage level.

7. The memory device according to claim 6, wherein in the erasing phase, the global word line driver applies the initial voltage to de-selected sectors of the sectors that need to maintain the voltage levels of the local word lines as the first voltage level.

8. The memory device according to claim 1, wherein the global word line driver applies a recovery voltage, in a recovery stage, to the sectors to set the voltage levels of the local word lines as a ground voltage level.

9. A memory device, comprising:
a first local word line driver, driving a first local word line with a biasing voltage, so that the first local word line has a first voltage level corresponding to a non-erased state; and
a second local word line driver, driving a second local word line with an erasing voltage, so that the second local word line has a second voltage level corresponding to an erased state;
wherein the first local word line driver receives the erasing voltage via a global word line in an erasing phase, the first local word line driver comprises:
a first transistor, coupled between the global word line and the first local word line, controlled by a first control signal;
a second transistor, coupled between the global word line and the first local word line, controlled by a second control signal;
a third transistor, coupled between the first local word line and a power source for providing the biasing voltage, controlled by the first control signal; and
a fourth transistor, coupled to the first local word line, controlled by a third control signal;
wherein in the erasing phase, the first and second transistors are turned off by the first and second control signals, respectively, and the third and fourth transistors are turned on by the first and third control signals, respectively.

10. The memory device according to claim 9, wherein the second local word line driver receives the erasing voltage via the global word line in the erasing phase, the second local word line driver comprises:
a fifth transistor, coupled between the global word line and the second local word line, controlled by a fourth control signal;
a sixth transistor, coupled between the global word line and the second local word line, controlled by a fifth control signal;
a seventh transistor, coupled between the second local word line and a power source for providing the biasing voltage, controlled by the fourth control signal; and
an eighth transistor, coupled to the second local word line, controlled by a sixth control signal;
wherein in the erasing phase, the fifth and sixth transistors are turned on by the fourth and fifth control signals, respectively, and the seventh and eighth transistors are turned off by the fourth and sixth control signals, respectively.

11. The memory device according to claim 9, wherein in the erasing phase, the erasing voltage is at a negative voltage level and the biasing voltage is at a positive voltage level.

12. An operating method of a memory device comprising a plurality of local word lines, the operating method comprising:
driving a first local word line of the local word lines with a biasing voltage, so that the first local word line has a first voltage level corresponding to a non-erased state; and
driving a second local word line of the local word lines with an erasing voltage, so that the second local word line has a second voltage level corresponding to an erased state;
wherein the erasing voltage is applied to a first local word line driver via a global word line in an erasing phase, the first local word line driver drives the first local word line and comprises a first transistor coupled between the global word line and the first local word line, a second transistor coupled between the global word line and the first local word line, a third transistor coupled between the first local word line and a power source for providing the biasing voltage, and a fourth transistor coupled to the first local word line, wherein the first, second, third and fourth transistors are controlled by a first control signal, a second control signal, a third control signal and a fourth control signal, respectively, the step of driving the first local word line of the local word lines with the biasing voltage further comprising:
turning on the first and second transistor by the first and second control signals, respectively, when the voltage level of the global word line is the biasing voltage;
turning off the first and second transistors by the first and second control signals, respectively; and
turning on the third and fourth transistors by the first and third control signals, respectively.

13. The operating method according to claim 12, wherein the erasing voltage is applied to a second local word line driver via the global word line in the erasing phase, the second local word line driver drives the second local word line and comprises a fifth transistor coupled between the global word line and the second local word line, a sixth transistor coupled between the global word line and the second local word line, a seventh transistor coupled between the second local word line and a power source for providing the biasing voltage, and an eighth transistor coupled to the second local word line and controlled by a sixth control signal, the step of driving the second local word line of the local word lines with the erasing voltage further comprising:
turning on the fifth and sixth transistors by the fourth and fifth control signals, respectively; and
turning off the seventh and eighth transistors by the fourth and sixth control signals, respectively.

14. The operating method according to claim 12, wherein in the erasing phase, the biasing voltage is at a positive voltage level.

15. The operating method according to claim 12, wherein the memory device comprises a plurality of sectors coupled to the local word lines, the operating method further comprising:
applying the erasing voltage, in the erasing phase, to the first local word line driver and a second local word line driver via the global word line; and
applying an initial voltage, in an initial stage, to the sectors that need to set the voltage levels of the local word lines as the first voltage level.

16. The operating method according to claim 15, further comprising:
applying the initial voltage, in the erasing phase, to de-selected sectors of the sectors that need to maintain the voltage levels of the local word lines as the first voltage level.

17. The operating method according to claim 12, wherein the memory device comprises a plurality of sectors coupled to the local word lines, the operating method further comprising:

applying a recovery voltage, in a recovery stage, to the sectors to set all the local word lines at a ground level.

* * * * *